(12) United States Patent  
Tominaga et al.

(10) Patent No.: US 6,811,630 B2  
(45) Date of Patent: Nov. 2, 2004

(54) ULTRASONIC VIBRATION METHOD AND ULTRASONIC VIBRATION APPARATUS

(75) Inventors: Morio Tominaga, Kanagawa (JP); Shinji Iwahashi, Kanagawa (JP)

(73) Assignee: Sony Corporation (JP)

( * ) Notice: Subject to any disclaimer, the term of this patent is extended or adjusted under 35 U.S.C. 154(b) by 150 days.

(21) Appl. No.: 10/181,686

(22) PCT Filed: Nov. 19, 2001

(86) PCT No.: PCT/JP01/10078

§ 371 (c)(1),  
(2), (4) Date: Jul. 19, 2002

(87) PCT Pub. No.: WO02/40185

PCT Pub. Date: May 23, 2002

(65) Prior Publication Data

US 2003/0019561 A1 Jan. 30, 2003

(30) Foreign Application Priority Data

Nov. 20, 2000 (JP) ..................................... P2000-352507  
May 31, 2001 (JP) ..................................... P2001-165707

(51) Int. Cl.⁷ ............................................. B29C 65/08  
(52) U.S. Cl. ................. 156/73.1; 156/580.1; 156/580.2  
(58) Field of Search ...................... 156/64, 73.1, 580.1, 156/580.2; 264/442, 443, 445; 425/174.2; 228/1.1, 110.1

(56) References Cited

U.S. PATENT DOCUMENTS

| | | | | |
|---|---|---|---|---|
| 4,483,571 A | * | 11/1984 | Mishiro | 310/323.19 |
| 4,582,239 A | * | 4/1986 | Scotto | 228/1.1 |
| 5,476,570 A | * | 12/1995 | Widmann | 156/515 |
| 5,730,351 A | * | 3/1998 | Hermann | 228/1.1 |
| 5,828,156 A | * | 10/1998 | Roberts | 310/317 |
| 6,605,178 B1 | * | 8/2003 | Shinohara et al. | 156/379.6 |

FOREIGN PATENT DOCUMENTS

| | | |
|---|---|---|
| JP | 48-76974 | 10/1976 |
| JP | 64-8979 | 1/1989 |
| JP | 11-45912 | 2/1999 |

* cited by examiner

*Primary Examiner*—James Sells  
(74) *Attorney, Agent, or Firm*—Rader, Fishman & Grauer PLLC; Ronald P. Kananen

(57) ABSTRACT

An ultrasonic vibration method and an ultrasonic vibration apparatus, which do not have a directional property in the direction of vibrations, are disclosed. A pair of ultrasonic horns (11), (12), each having an ultrasonic vibrator (13), (14) provided at an end portion thereof, are disposed in an intersecting relationship to each other, and the composite vibrations of transverse vibrations produced by the pair of ultrasonic horns (11), (12) when the other ultrasonic horns (12), (11) are excited to generate longitudinal vibrations are extracted at the intersecting point of the pair of horns (11), (12) and applied to a contact object member through a presser (22).

29 Claims, 10 Drawing Sheets

ULTRASONIC VIBRATION METHOD AND ULTRASONIC VIBRATION APPARATUS

TECHNICAL FIELD

This invention relates to an ultrasonic vibration method and an ultrasonic vibration apparatus and, more particularly, to an ultrasonic vibration method and an ultrasonic vibration apparatus wherein a pair of ultrasonic horns coupled in an intersecting relationship to each other are used.

BACKGROUND ART

A bonding apparatus and a bonding method for an electronic part with bumps which utilizes ultrasonic vibrations are disclosed, for example, in Japanese Patent Laid-Open No. Hei 11-45912. Here, a pair of horns are disposed in an opposing relationship to each other on a common axis, and a piezoelectric element is attached to each of the horns. Further, an attracting tool is provided at the center of a narrow connecting portion intermediate between the opposing horns, and a semiconductor chip having bumps thereon is held by the attracting tool. Besides, the semiconductor chip here is resiliently held by and between a spring and a rib from a direction substantially perpendicular to the direction of the axis of the horns.

In the bonding apparatus and the bonding method described above, the semiconductor chip is subject to vibrations in the axial direction of the horns by the horns. In an initial stage, when the semiconductor chip is moved in the vibration direction with respect to a board, oxide films of the bumps and electrodes are broken. Then, as the bonding proceeds, the semiconductor chip slips with respect to the holding means formed from the spring and the rib as a result of an increase of the bonding force between the bumps and the electrodes, thereby to connect the bumps of the semiconductor chip and the electrodes of the board to each other.

Such an ultrasonic bonding apparatus as disclosed in Japanese Patent Laid-Open No. Hei 11-45912 has a problem in that, where it is used for bonding of a semiconductor chip, it sometimes fails to bond a semiconductor device of the type wherein a plurality of bumps are arranged in an arbitrary arrangement in such conditions that the bonding force of all of the bumps is higher than a desired value and no significant mechanical defect occurs. The ultrasonic bonding apparatus has a problem that, for example, if ultrasonic vibrations are applied to a semiconductor chip wherein bumps are arranged along a periphery of an electrode face of a semiconductor bare chip such that the vibration direction thereof is the same direction as that of one side of the rectangular bare chip, then if the bonding conditions are optimized so that the bonding strength of all bumps may be higher than a predetermined value, then those bumps disposed along the sides extending in the direction perpendicular to the application direction of the ultrasonic vibrations, particularly those bumps which are at corner portions of the rectangle of the bare chip, are likely to suffer from cratering.

Further, the ultrasonic bonding apparatus has a problem that, if the bonding conditions are set conversely so that such cratering as mentioned above may not occur with any of the bumps, then the bonding strength of those bumps that are disposed on the sides of the semiconductor chip which extend in parallel to the application direction of the ultrasonic vibrations does not reach a sufficient value. Such a phenomenon as just described appears conspicuously, particularly where a board having a low hardness such as, a glass epoxy type board is used as a mounting substrate.

The present invention has been made in view of the problems described above, and it is an object of the present invention to provide an ultrasonic vibration method and an ultrasonic vibration apparatus by which, where the apparatus is used as a bonding apparatus for a semiconductor chip wherein a plurality of bumps are arranged in an arbitrary arrangement, the bumps can be bonded while a sufficient bonding strength is assured without causing mechanical damage such as cratering to occur with all the pad electrodes to be electrically connected.

DISCLOSURE OF INVENTION

The present invention relates to an ultrasonic vibration method characterized in that a pair of ultrasonic horns are coupled in an intersecting relationship to each other, and a first one of the ultrasonic horns is excited to longitudinally vibrate in a lengthwise direction thereof to cause a second one of the ultrasonic horns to generate transverse vibrations while the second ultrasonic horn is excited to longitudinally vibrate in a lengthwise direction thereof to cause the first ultrasonic horn to generate transverse vibrations, such that composite vibrations of the transverse vibrations of the pair of ultrasonic horns that are produced at the intersecting coupling position of the pair of ultrasonic horns are used as an output.

Here, the pair of ultrasonic horns may intersect substantially perpendicularly with each other and produce the composite vibrations within a plane substantially in parallel to the plane which includes the pair of ultrasonic horns. A presser may be provided at the intersecting coupling position of the pair of ultrasonic horns and projected substantially perpendicularly to the plane, which includes the pair of ultrasonic horns; and, the presser may be pressed against a contact object member to transmit the composite vibrations to the contact object member. The contact object member may be bonded to another member by the composite vibrations.

A pair of ultrasonic vibrators for individually providing vibrations to the pair of ultrasonic horns may be provided, and the phase relationship between ultrasonic signals to be applied to the pair of ultrasonic vibrators may be adjusted. Adjustment of the phase of one of the pair of ultrasonic vibrators may be performed to adjust the phase relationship between the signals to the pair of ultrasonic vibrators. The amplitudes or the angular velocities of or the phase difference between the ultrasonic signals to be applied to the pair of ultrasonic vibrators may be adjusted to vary the locus of the composite vibrations in a plane parallel to the plane, which includes the pair of ultrasonic horns. The pair of ultrasonic horns may have a length substantially equal to the wavelength of ultrasonic waves which propagate in the pair of ultrasonic horns or substantially equal to an integral number of times the wavelength. Each of the pair of ultrasonic horns may be fixed at least at a position of a node. The pair of ultrasonic horns may intersect with and be coupled to each other, each at a substantially middle portion in the lengthwise direction thereof, such that the amplitude of the longitudinal vibrations is maximum at the intersecting coupling position, and each may be fixed by fixing means at a position spaced by a half wavelength or a distance of the sum of a half wavelength and an integral number of times one wavelength from the intersecting coupling position The present invention according to a first principal aspect relating to an ultrasonic vibration apparatus relates to an ultrasonic vibration apparatus characterized in that it comprises a pair of ultrasonic horns coupled in an intersecting relationship to each other, and a first one of the ultrasonic horns is excited to longitudinally vibrate in a lengthwise direction thereof to cause a second one of the ultrasonic horns to generate transverse vibrations while the second ultrasonic horn is excited to longitudinally vibrate in a lengthwise direction thereof to cause the first ultrasonic horn to generate transverse vibrations, such that composite vibrations of the transverse vibrations of the pair of ultrasonic horns that are produced at the intersecting coupling position of the pair of ultrasonic horns are used as an output.

Here, the pair of ultrasonic horns may intersect substantially perpendicularly with each other and produce the composite vibrations within a plane substantially in parallel to the plane which includes the pair of ultrasonic horns. The ultrasonic vibration apparatus may further comprise a presser provided at the intersecting coupling position of the pair of ultrasonic horns and projected substantially perpendicularly to the plane, which includes the pair of ultrasonic horns; and, the presser may be pressed against a contact object member to transmit the composite vibrations to the contact object member. The contact object member may be bonded to another member by the composite vibrations.

The ultrasonic vibration apparatus may further comprise a pair of ultrasonic vibrators for individually providing vibrations to the pair of ultrasonic horns, and the phase relationship between ultrasonic signals to be applied to the pair of ultrasonic vibrators may be adjusted. Adjustment of the phase of at least one of the pair of ultrasonic vibrators may be performed. The amplitudes or the angular velocities of or the phase difference between the ultrasonic signals to be applied to the pair of ultrasonic vibrators may be adjusted to vary the locus of the composite vibrations in a substantially same plane.

The pair of ultrasonic horns may have a length substantially equal to the wavelength of ultrasonic waves which propagate in the pair of ultrasonic horns or substantially equal to an integral number of times the wavelength. Each of the pair of ultrasonic horns may be fixed at least at a position of a node by fixing means. The pair of ultrasonic horns may intersect with and be coupled to each other, each at a substantially middle portion in the lengthwise direction thereof such that the longitudinal vibrations exhibit a maximum amplitude at the intersecting coupling position, and each may be fixed by fixing means at a position spaced substantially by a half wavelength or a distance of the sum of a half wavelength and an integral number of times one wavelength from the intersecting coupling position. An odd-numbered order natural frequency of the transverse vibrations of the first ultrasonic horn may substantially coincide with the frequency of an ultrasonic vibrator of the second ultrasonic horn, which intersects with the first ultrasonic horn, such that the transverse vibrations thereof substantially resonate with the ultrasonic vibrations of the second ultrasonic horn.

The present invention according to another principal aspect relating to an ultrasonic vibration apparatus relates to an ultrasonic vibration apparatus characterized in that it comprises a pair of ultrasonic horns coupled in a substantially intersecting relationship to each other in a predetermined plane, an ultrasonic vibrator attached to an end portion of each of the ultrasonic horns, an ultrasonic oscillator for supplying ultrasonic signals to the pair of ultrasonic vibrators, and a presser provided at the intersecting coupling position of the pair of ultrasonic horns for being pressed against a contact object member, and that the pair of ultrasonic horns are excited to individually vibrate longitudinally such that the contact object member is bonded through the presser by composite vibrations of transverse vibrations produced at the intersecting coupling position.

Here, the ultrasonic vibration apparatus may further comprise phase adjustment means for adjusting the phase of the ultrasonic signals to be applied to the pair of ultrasonic vibrators. The phase adjustment means may be provided between at least one of the ultrasonic vibrators and the ultrasonic oscillator. The amplitudes or the angular velocities of or the phase difference between the ultrasonic signals to be applied to the pair of ultrasonic vibrators may be adjusted to vary the locus of the composite vibrations in the predetermined plane.

One of the ultrasonic horns may have a length substantially equal to the wavelength of ultrasonic waves which propagate in the ultrasonic horns or substantially equal to an integral number of times the wavelength. Each of the pair of ultrasonic horns may be fixed at least at a position of a node by fixing means. The pair of ultrasonic horns intersect with and may be coupled to each other each at a substantially middle portion in the lengthwise direction thereof such that the amplitude of the longitudinal vibrations is maximum at the intersecting coupling position, and each may be fixed by fixing means at a position spaced by a half wavelength or a distance of the sum of a half wavelength and an integral number of times one wavelength from the intersecting coupling position. An odd-numbered order natural frequency of the transverse vibrations of a first one of the ultrasonic horns may substantially coincide with the frequency of the ultrasonic vibrator of a second one of the ultrasonic horns which intersects with the first ultrasonic horn, such that the transverse vibrations thereof substantially resonate with the ultrasonic vibrations of the second ultrasonic horn.

A preferred form of the invention included in the present invention relates to an ultrasonic vibration method and an ultrasonic vibration apparatus for bonding a semiconductor chip which forms a flip chip IC to an electronic circuit board using ultrasonic waves, configured such that it comprises a pair of ultrasonic oscillators, a phase adjustment apparatus for adjusting the phase difference between ultrasonic signals outputted from the ultrasonic oscillators, two ultrasonic vibrators for generating ultrasonic waves in response to the ultrasonic signals from the ultrasonic oscillator, and a pair of ultrasonic horns intersecting in a substantially cross-shape with each other on an X-Y plane; and ultrasonic vibrations are attached individually to the ultrasonic horns and the amplitude and the angular velocity of the vibrations in the X-axis direction, the amplitude and the angular velocity of the vibrations in the Y-axis direction and the phase difference between the vibrations in the X-axis direction and the Y-axis direction are individually adjusted to appropriate values such that the semiconductor chip is pressed in vibrations against the electronic circuit board with an optimum locus in the X-Y plane to improve the bonding strength and the uniformity in bonding between the semiconductor chip and the electronic circuit board.

Here, the ultrasonic horns for the X-axis direction and the Y-axis direction that are coupled in an intersecting relationship in a substantially cross-shape to each other may have a length substantially equal to an integral number of times the wavelength of ultrasonic waves which propagate in the ultrasonic horns; and, besides each may be fixed at a position spaced by a ½ wavelength or a distance of the sum of a ½ wavelength and a distance of an integral number of times one wavelength from the center of the ultrasonic horns. Further, the pair of ultrasonic horns disposed in an intersecting relationship with each other generate such vibrations that longitudinal vibrations in one of the X-axis direction and the Y-axis direction by ultrasonic waves cause the ultrasonic horn for the other of the X-axis direction and the Y-axis direction to generate transverse vibrations, and composite vibrations produced by synthesis of the transverse vibrations of the ultrasonic horn for the X-axis direction and the transverse vibrations of the ultrasonic horn for the Y-axis direction form an arbitrary locus in the X-Y plane. Further, where an odd-numbered order natural frequency of the transverse frequency of the ultrasonic horn in this instance is set coincident with the frequency of the ultrasonic oscillator, the transverse vibrations resonate with the ultrasonic vibrations. Consequently, an ultrasonic vibration apparatus, which generates preferred vibrations is obtained.

Where such an ultrasonic vibration method and an ultrasonic vibration apparatus as described above are used for bonding of a semiconductor chip formed from a flip chip IC and an electronic circuit board, even if the arrangement of bumps of the semiconductor chip differs in various manners, since the direction of the ultrasonic vibrations includes components of the two directions of the X-axis direction and the Y-axis direction, a bonding quality having a stable bonding strength and a uniformity in bonding is achieved without being influenced by the direction of arrangement of the bumps.

BEST MODE FOR CARRYING OUT THE INVENTION

Figure 1:
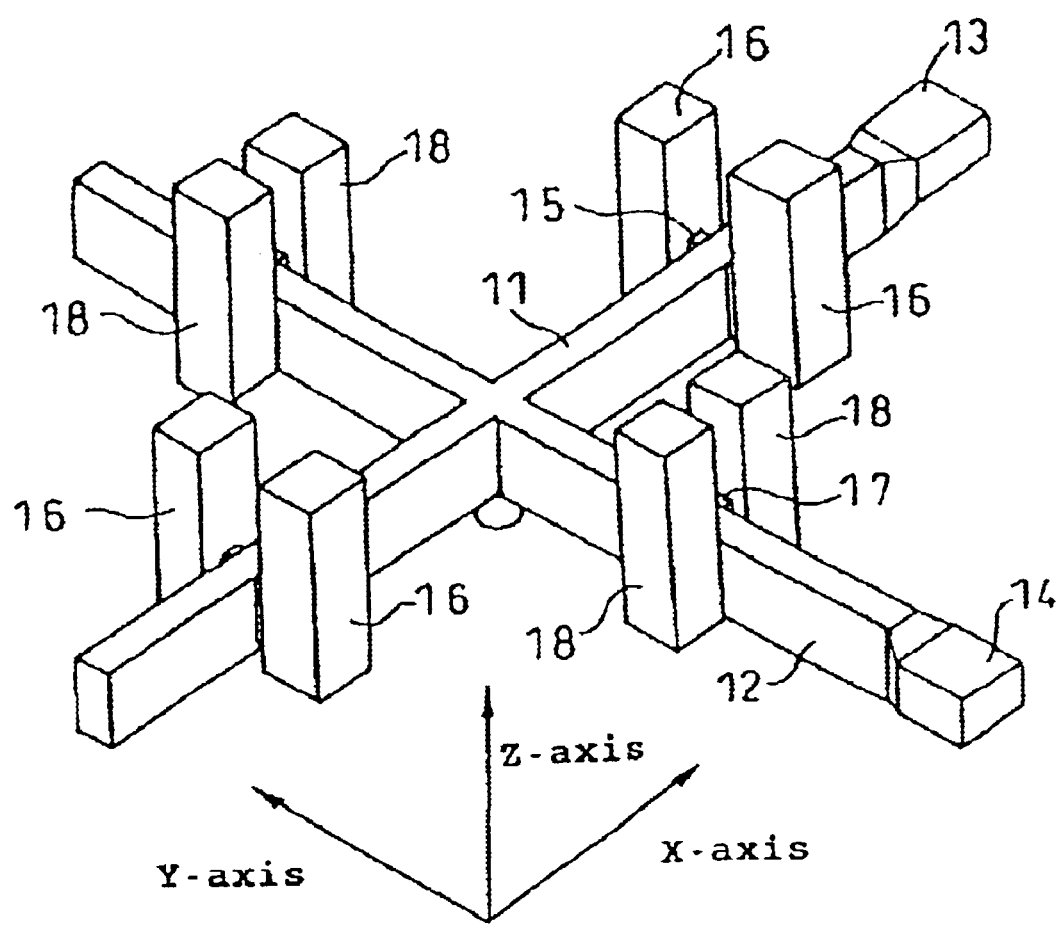
FIG. 1 is a perspective view of an essential part of an ultrasonic vibration apparatus to which an ultrasonic vibration method of an embodiment is applied.
Figure 2:
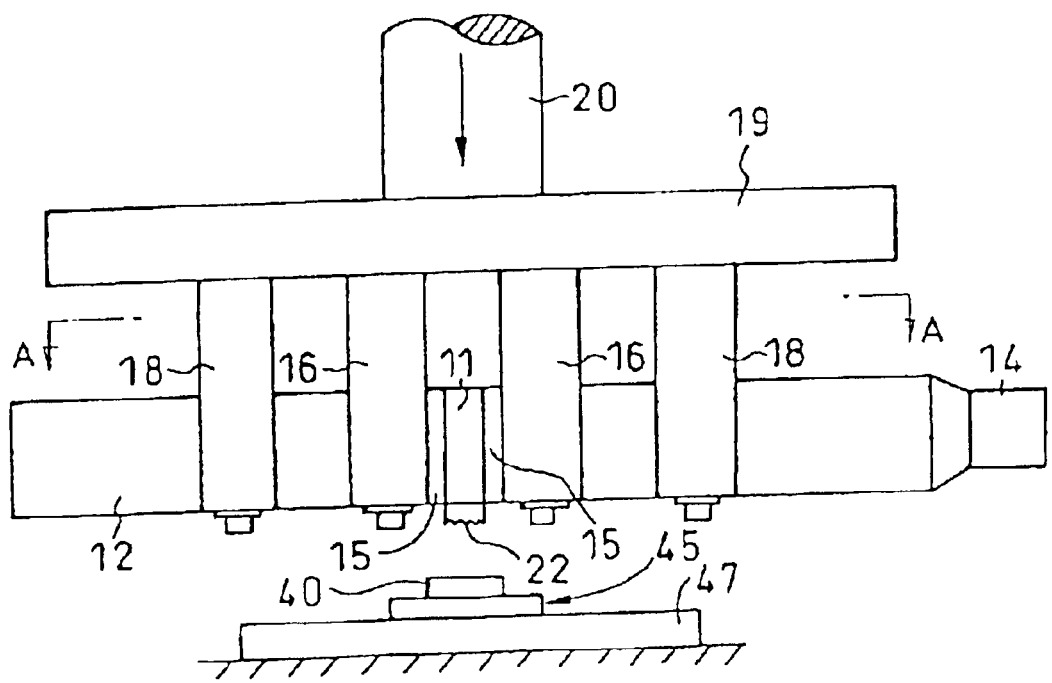
FIG. 2 is a front elevational view of an essential part of the ultrasonic vibration apparatus.
Figure 3:
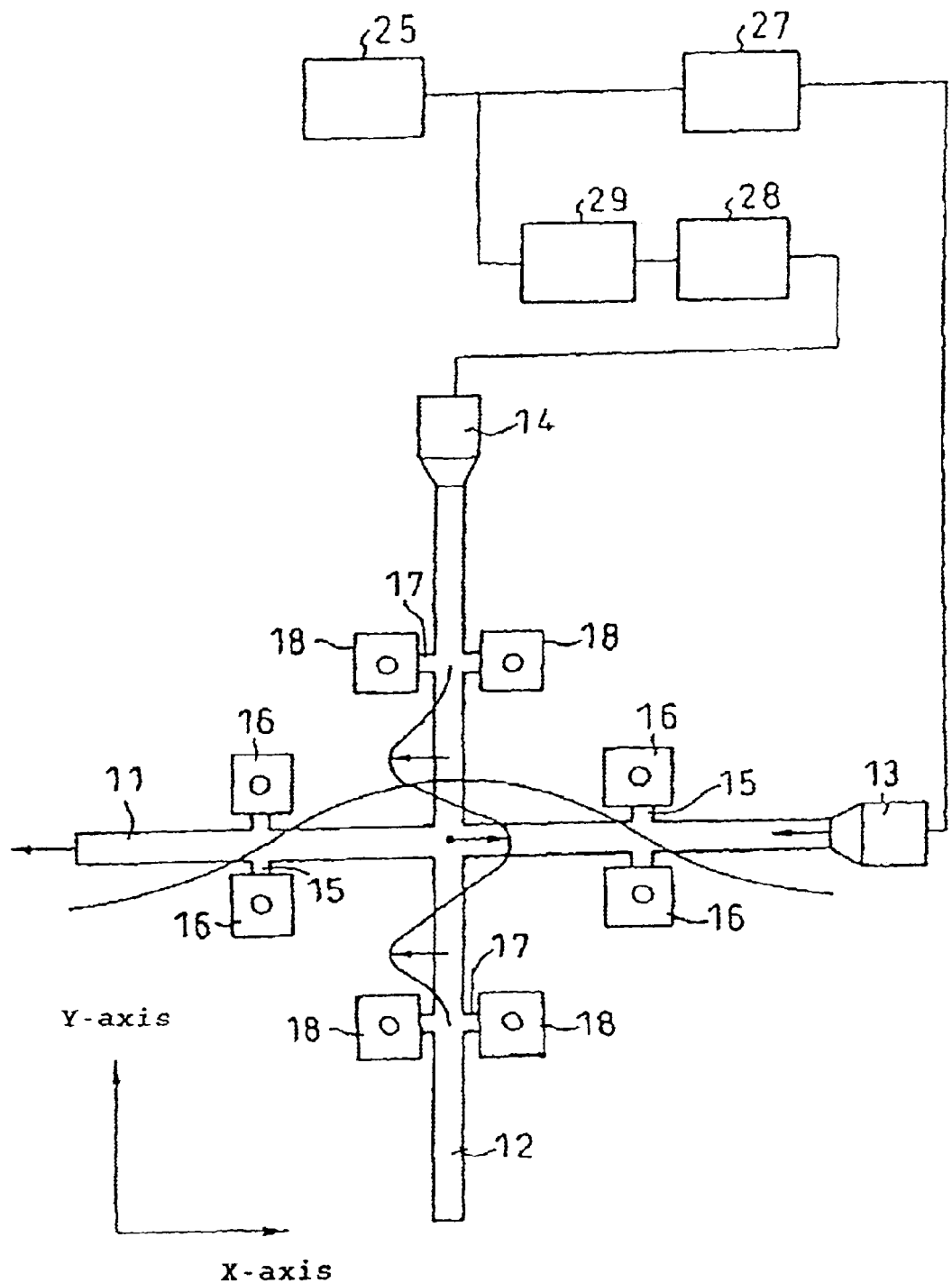
FIG. 3 is a sectional view taken along line A—A of FIG. 2.

FIGS. 1 to 3 show a general configuration of an ultrasonic vibration apparatus to which an ultrasonic vibration method according to an embodiment of the present invention is applied. The present ultrasonic vibration apparatus includes a pair of ultrasonic horns 11 and 12 disposed perpendicularly to each other, as shown in FIG. 1. Here, the ultrasonic horn 11 is disposed in the direction of an X-axis while the ultrasonic horn 12 is disposed in the direction of a Y-axis. Ultrasonic vibrators 13 and 14 are attached to end portions of the pair of ultrasonic horns 11 and 12, respectively. The ultrasonic vibrators 13 and 14 cause the ultrasonic horns 11 and 12 to generate vibrations in the lengthwise directions, that is, in the longitudinal directions, respectively.

The ultrasonic horn 11 is connected at an intermediate position between the center and each of the opposite ends thereof, that is, at each nodal point, to fixed rods 16 through arms 15 on the opposite sides thereof. Similarly, the ultrasonic horn 12 for the Y-axis direction is coupled at an intermediate position between a middle portion and each of the opposite ends in the longitudinal direction thereof to fixed rods 18 through arms 17 on the opposite side thereof. The fixed rods 16 and 18 are securely mounted on a lower face of a support plate 19 shown in FIG. 2. The support plate 19 is securely mounted at an end portion of a vertical shaft 20 which is movable upwardly and downwardly in the direction of a Z-axis A presser 22 is mounted on a lower face at an intersecting position of the pair of ultrasonic horns 11 and 12.

In order to cause the ultrasonic horns 11 and 12 to vibrate longitudinally, a control circuit 25 shown in FIG. 3 is provided. The control circuit 25 is connected to a pair of ultrasonic oscillators 27 and 28. Here, a phase adjuster 29 is connected between the ultrasonic oscillator 28 for the Y-axis direction and the control circuit 25, so that a predetermined phase difference may be produced between outputs of the pair of ultrasonic oscillators 27 and 28.

In such a configuration as described above, the ultrasonic oscillators 27 and 28 supply ultrasonic signals to the ultrasonic vibrators 13 and 14, respectively, under the control of the control circuit 25. The phase difference between the pair of ultrasonic oscillators 27 and 28 in this instance is adjusted arbitrarily by means of the phase adjuster 29.

The ultrasonic horn 11 for the X-axis direction generates longitudinal vibrations in the longitudinal direction thereof, as seen in FIG. 3, in response to the ultrasonic signal applied to the ultrasonic oscillator 13. The longitudinal vibrations exhibit maximum amplitude at the opposite ends and the central portion of the ultrasonic horn 11 and exhibit an amplitude of 0 at each of the positions at which the ultrasonic horn 11 is fixed by a pair of fixed rods 16. From such longitudinal vibrations, as just described, the ultrasonic horn 12 for the Y-axis direction, which extends perpendicularly to the ultrasonic horn 11 for the X-axis direction, produces transverse vibrations.

Figure 4:
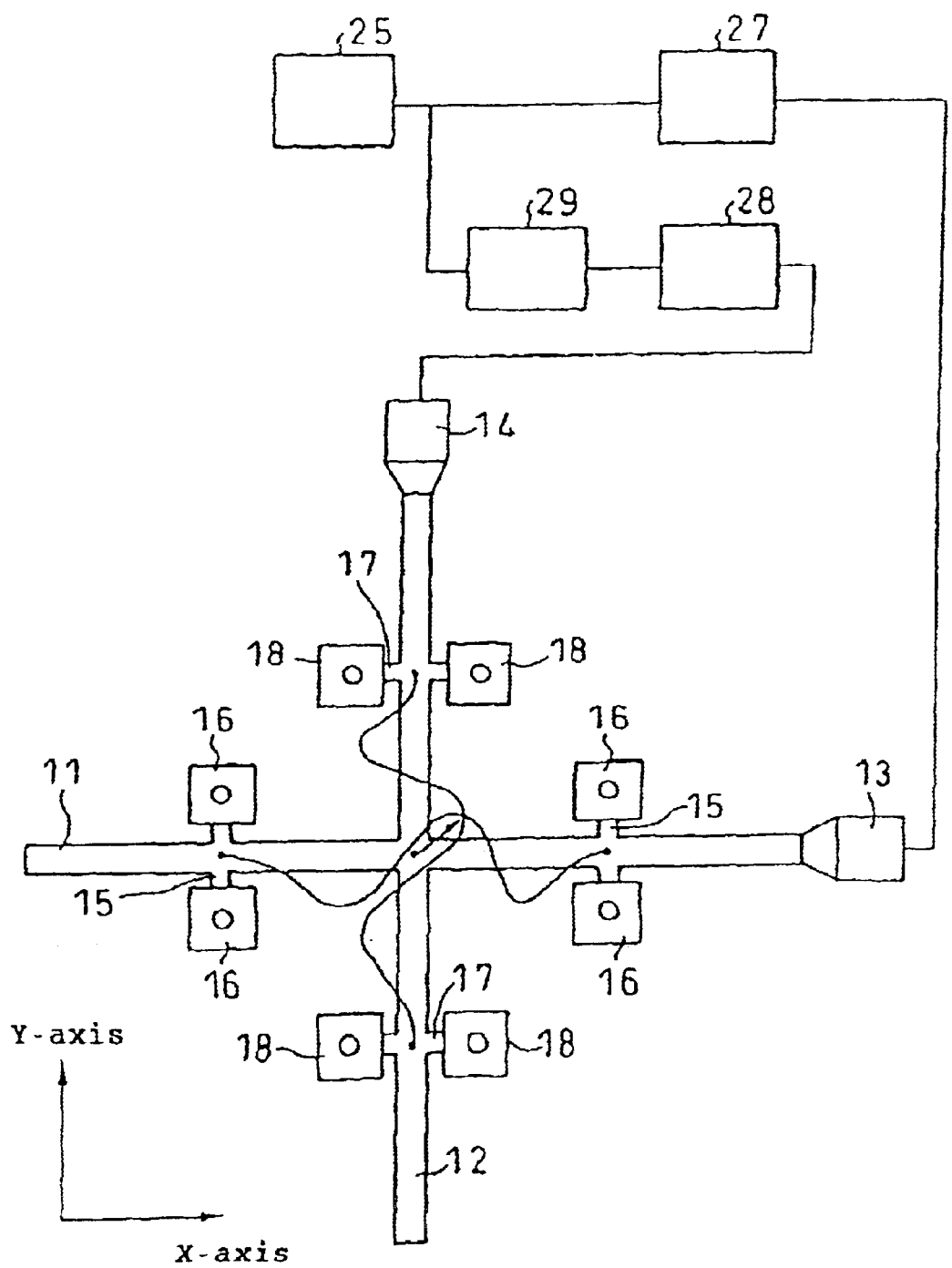
FIG. 4 is a plan view similar to FIG. 3 but illustrating transverse vibrations generated by a pair of horns extending perpendicularly to each other.

Similarly, the ultrasonic oscillator 14 excites the ultrasonic horn 12 for the Y-axis direction to generate longitudinal vibrations in response to the ultrasonic signal applied from the ultrasonic oscillator 28. Consequently, the ultrasonic horn 11 for the X-axis direction generates transverse vibrations. FIG. 4 illustrates the transverse vibrations of the pair of ultrasonic horns 11 and 12. Composite vibrations of the transverse vibrations are extracted from the intersecting coupling position of the pair of ultrasonic horns 11 and 12. In particular, the composite vibrations are extracted at the central position of the ultrasonic horns 11 and 12 at which the presser 22 is provided. Such composite vibrations are composite vibrations with which an end portion of the composite vibrations shown in FIG. 4 draws an arbitrary locus depending upon the amplitudes and angular velocities of and the phase difference between the ultrasonic vibrations applied to the ultrasonic horn 11 for the X-axis direction and the ultrasonic horn 12 for the Y-axis direction.

In this manner, with the ultrasonic vibration method and the ultrasonic vibration apparatus of the present embodiment, ultrasonic signals outputted from the pair of ultrasonic oscillators 27 and 28 are applied to the ultrasonic vibrators 13 and 14, respectively. At this time, the phases of the two ultrasonic signals are adjusted by means of the phase adjuster 29. It is to be noted that the phase adjuster may be formed from a timer which displaces the starting time of oscillation.

The pair of ultrasonic horns 11 and 12, to which the ultrasonic vibrators 13 and 14 are attached, respectively, are disposed such that the directions of vibrations thereof may be perpendicular to each other. Now, it is assumed that the vibrations applied to the ultrasonic horn 11 for the X-axis direction are x=A$\cos\omega_1$t in the X-axis direction. Meanwhile, it is assumed that the vibrations in the Y-axis direction applied by the ultrasonic oscillator 14 are y=B$\cos(\omega_2 t-\alpha)$. It is to be noted here that t represents time.

The amplitudes A and B of the two ultrasonic horns 11 and 12 can be set freely by adjusting the intensity of the ultrasonic signals of the pair of ultrasonic oscillators 27 and 28. Also the phase difference $\alpha$ between the vibrations in the two directions can be adjusted arbitrarily by means of the phase adjuster 29 described hereinabove.

The angular velocity $\omega_1$ of the vibrations in the X-axis direction and the angular velocity $\omega_2$ of the vibrations in the Y-axis direction are set coincident with the angular velocity $\omega_1$ corresponding to the natural frequency in the longitudinal direction of the ultrasonic horn 11 for the X-axis direction and the angular velocity $\omega_2$ corresponding to the natural frequency of the longitudinal vibrations in the Y-axis direction, respectively. Consequently, the amplitude at the intersecting coupling position of the pair of ultrasonic horns 11 and 12 becomes a maximum amplitude. In other words, the angular velocities $\omega_1$ and $\omega_2$ of the vibrations in the two directions are selected based on the design of the ultrasonic horns 11 and 12.

First, excitation with vibrations of x=A$\cos\omega_1$t by the ultrasonic oscillator 13 for the X-axis direction is described. Referring to FIG. 3, the length of the ultrasonic horn 11 for the X-axis direction is designed equal to the length of one wavelength of longitudinal vibrations of the ultrasonic horn 11 by ultrasonic vibrations. Further, the fixed rods 16 are fixed at the positions of 0.5 wavelengths. It is to be noted that the fixed rods 16 may be formed integrally with or as separate members from the ultrasonic horn 11.

In FIG. 3, the amplitude of the longitudinal vibrations in the X-axis direction is represented by a displacement in the Y-axis direction for the convenience of illustration. The amplitude of the longitudinal vibrations of the ultrasonic horn 11 exhibits its maximum amplitude at the movable pressurization point of the ultrasonic horn 11 at which the presser 22 is provided. Also, the ultrasonic horn 12 for the Y-axis direction is fixed by the fixed rods 18 similarly.

The third order natural frequency of vibrations in the X-axis direction of the ultrasonic horn 12 for the Y-axis direction, that is, transverse vibrations, is set so as to coincide with the natural frequency of ultrasonic vibrations in the X-axis direction. Accordingly, when the movable pressurization point tends to move in the X-axis direction by a longitudinal vibration of the ultrasonic horn 11 for the X-axis direction, a third order transverse vibration of the ultrasonic horn 12 for the Y-axis direction is excited, and the ultrasonic horn 12 for the Y-axis direction forms such an amplitude vibration as shown in FIG. 3. Accordingly, the intersecting position between the ultrasonic horn 11 for the X-axis direction and the ultrasonic horn 12 for the Y-axis direction, that is, the movable pressurization point, moves with a substantially same vibration x=A$\cos\omega_1$t in the X-axis direction as shown in FIG. 3.

Then, in such a state as described above, vibrations of y=B$\cos(\omega_2 2t-\alpha)$ are applied to the ultrasonic horn 12 for the Y-axis direction by means of the ultrasonic oscillator 14. Here, since the angular velocity of the third order natural frequency in the transverse direction between the fixed rods 16 of the ultrasonic horn 11 for the X-axis direction is set so as to coincide with $\omega_2$, the movable pressurization point moves with the substantially same vibration y=B$\cos(\omega_2 t-\alpha)$ in the Y-axis direction similarly, as described above.

Consequently, the intersecting position of the ultrasonic horns 11 and 12 at which the presser 22 is provided, that is, the movable pressurization point, is transversely vibrated in both of the X-axis direction and the Y-axis direction. The vibration states of the cross-shaped ultrasonic horns in this state are shown in FIG. 4. In particular, FIG. 4 shows only patterns of the transverse vibrations of the ultrasonic horns 11 and 12. Accordingly, if the amplitudes A and B of the vibrations then and the angular velocities $\omega_1$ and $\omega_2$ of and the phase difference $\alpha$ between the vibrations are selected in such a manner as given in the following table, the locus by the vibrations of the movable pressurization point at which the presser 22 is provided becomes such as given below. The locus of the end of the vector of the composite vibrations then is represented by the patterns of FIGS. 5(A) to 5(I).

| $\omega$ | A | B | $\alpha$ | x | y | FIG. |
|---|---|---|---|---|---|---|
| When $\omega_1 = \omega_2 = \omega$ | A | 0 | 0 | A$\cos\omega$t | 0 | A |
|  | 0 | B | 0 | 0 | B$\cos\omega$t | B |
|  | A | A | 0 | A$\cos\omega$t | A$\cos\omega$t | C |
|  | A | A | 90° | A$\cos\omega$t | A$\sin\omega$t | D |
|  | A | A | 180° | A$\cos\omega$t | −A$\cos\omega$t | E |
|  | A | A | 270° | A$\cos\omega$t | −A$\sin\omega$t | F |
|  | A | 2A | 90° | A$\cos\omega$t | 2A$\sin\omega$t | G |
| When $\omega_1 = \omega$, $\omega_2 = 2\omega$ | A | A | 90° | A$\cos\omega$t | A$\sin2\omega$t | H |
| When $\omega_1 = \omega$, $\omega_2 = \omega + \Delta\omega$ | A | A | 90° | A$\cos\omega$t | A$\sin(\omega + \Delta\omega)$t | I |

Figure 6:
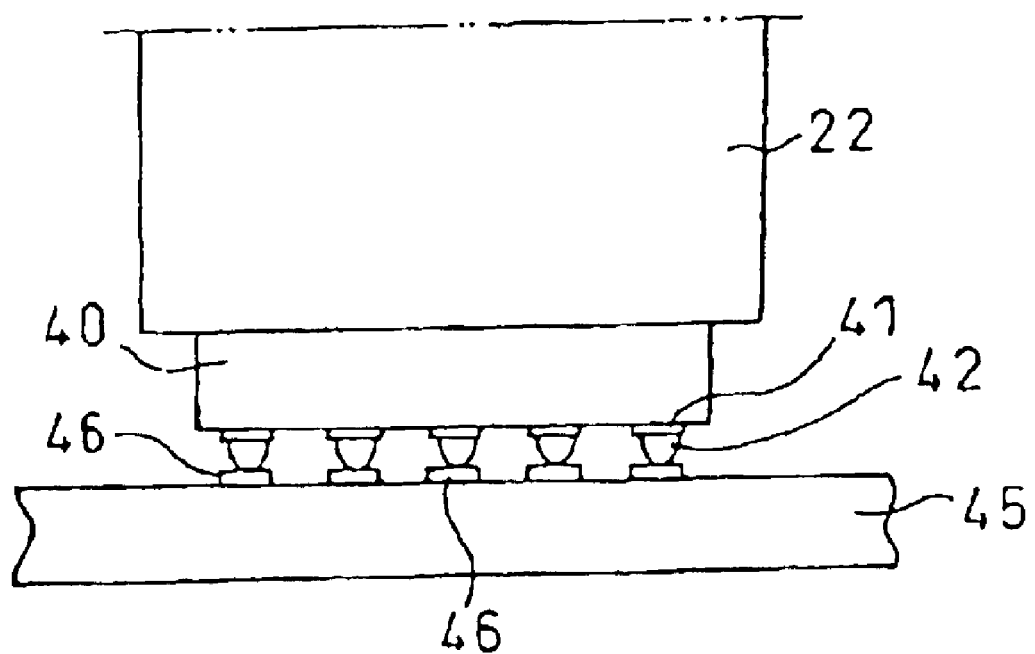
FIG. 6 is a front elevational view showing a semiconductor chip in a bonded state.
Figure 7:
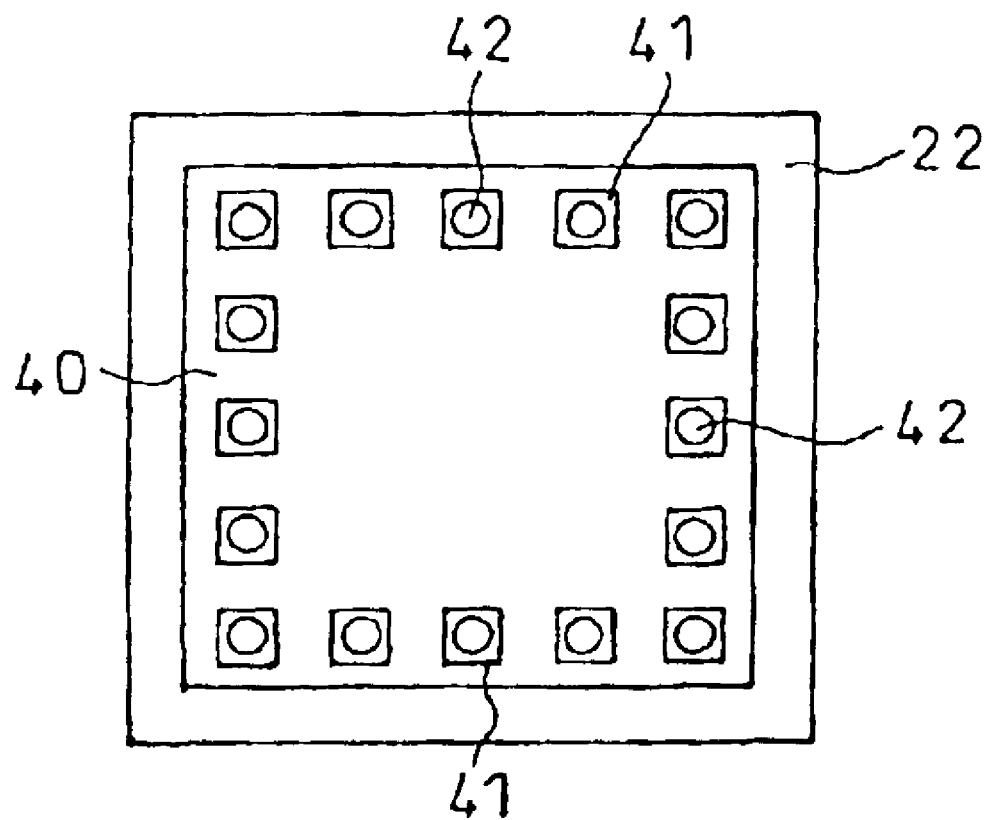
FIG. 7 is a bottom plan view of the semiconductor chip held by a presser.

Now, use of such an ultrasonic vibration method as described above and the ultrasonic vibration apparatus which uses the method to bond a semiconductor bare chip 40 and a board 45 to each other is described with reference to FIGS. 2 and 6 to 8. The semiconductor chip 40 formed from a bare chip has pad electrodes 41 formed along peripheral edge portions on an electrode face thereof, as shown in FIGS. 6 and 7. It is to be noted that the face on which the pad electrodes 41 are formed is coated with a surface protecting layer formed from, for example, a silicon nitride layer or a polyimide layer, and only portions thereof for the pad electrodes 41 are open. Bumps 42 made of a conductor, such as a metal, are formed on such pad electrodes 41. Consequently, the semiconductor chip 40 is formed of the peripheral pad type.

On the other hand, the board 45 onto which the semiconductor chip 40 is to be flip chip mounted is made of, for example, a ceramics type material, and electrodes formed from lands 46 made of a conductive material such as, for example, copper and coated with nickel, gold or the like by surface plating processing are formed at positions of the board 45 corresponding to the pad electrodes 41 of the semiconductor bare chip 40 to be mounted. The lands 46 are connected to wiring line portions formed on the front surface or the rear surface of the board 45.

Figure 8:
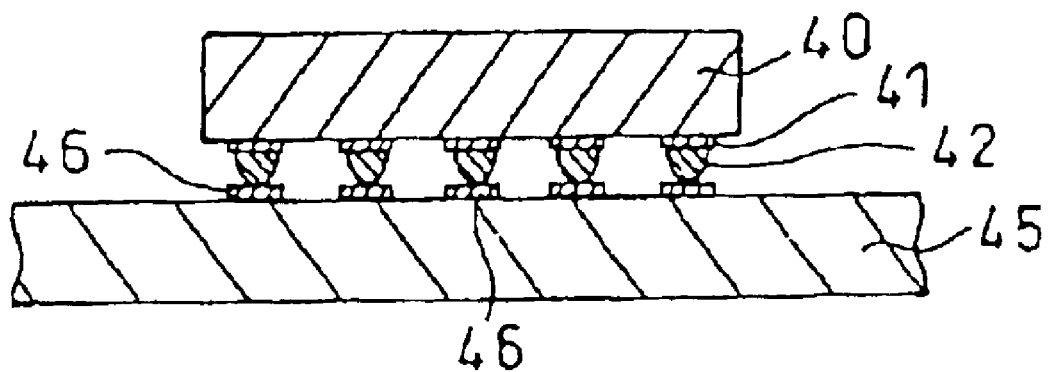
FIG. 8 is a vertical sectional view of the bonded semiconductor device.

In order to bond the semiconductor chip 40 to the board 45 having such a configuration as described above, the board 45 is placed onto a base 47, as shown in FIGS. 2 and 6, and the semiconductor chip 40 is disposed on the lower side of the presser 22 of the ultrasonic bonding apparatus such that the surface thereof on which the pad electrodes 41 are provided is directed downwardly. Then, in this state, the ultrasonic vibrators 13 and 14 are driven by the ultrasonic oscillators 27 and 28 to cause the ultrasonic horns 11 and 12 to individually vibrate longitudinally, respectively, such that composite vibrations are generated at the position at which the presser 22 is provided. By such composite vibrations, frictional heat is generated between end portions of the bumps 42 on the pad electrodes 41 and the lands 46 of the board 45. Consequently, at least the end portions of the bumps 42 or the lands 46 are melted and the pad electrodes 41 and the lands 46 are connected to each other, whereby such a semiconductor device as shown in FIG. 8 is obtained.

Figure 5:
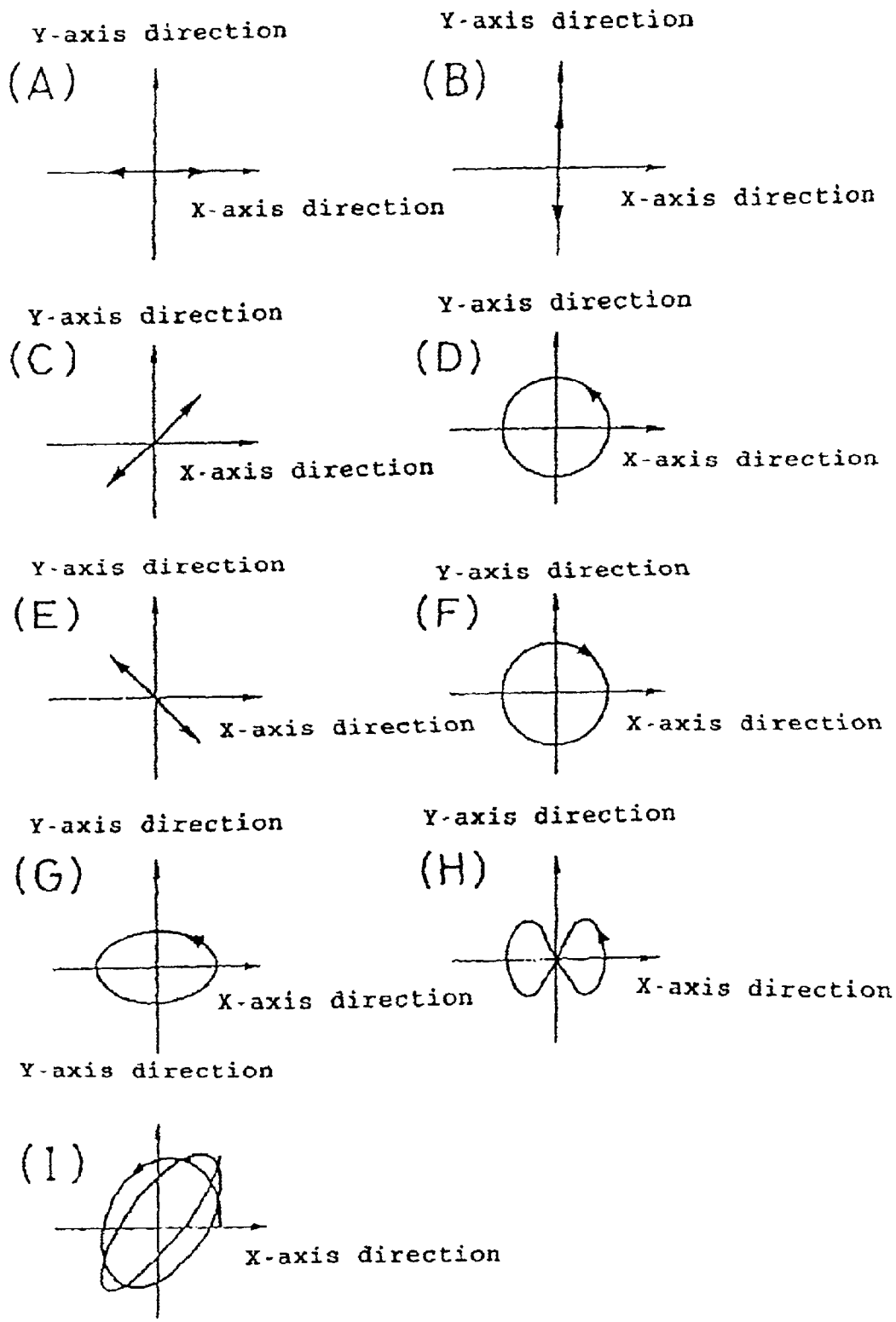
FIGS. 5(A) to 5(I) are plan views showing a locus of the vibrations.

The cross-shaped horns 11 and 12 are moved downwardly in a state wherein the movable pressurization point formed at the intersecting position of the pair of ultrasonic horns 11 and 12 vibrates in various loci, as shown in Table 1 and in FIG. 5, by ultrasonic vibrations in this manner, whereupon the presser 22 presses the semiconductor bare chip 40 against the board 45. Since the contact face of the presser 22 with the semiconductor chip 40 is designed so as to have high friction, the semiconductor chip 40 is ultrasonically bonded to the electronic circuit board 45 while drawing the same locus as that of the presser 22. Since an arbitrary locus can be selected from among such various loci of vibrations as shown by the patterns of FIGS. 5(A) to 5(I), if a uniform vibration pattern which does not rely upon the arrangement direction of the bumps 42 is formed on the electrode face of the semiconductor bare chip 40, then a stable bonding quality is obtained.

It is to be noted that, in such an ultrasonic vibration method and an ultrasonic variation apparatus as described above, the form or length of vibrations or the fixed position of each of the ultrasonic horn 11 for the X-axis direction and the ultrasonic horn 12 for the Y-axis direction can be selected arbitrarily. For example, it is possible to set the length of the ultrasonic horn 11 for the X-axis direction equal to the length of one wavelength of longitudinal vibrations generated with the ultrasonic horn 11 and make the first order natural frequency of transverse vibrations generated with the ultrasonic horn 12 for the Y-axis direction coincide with the frequency of ultrasonic vibrations. Consequently, vibrations in the transverse direction of the ultrasonic horn 12 for the Y-axis direction become such as illustrated in FIG. 9.

Figure 10:
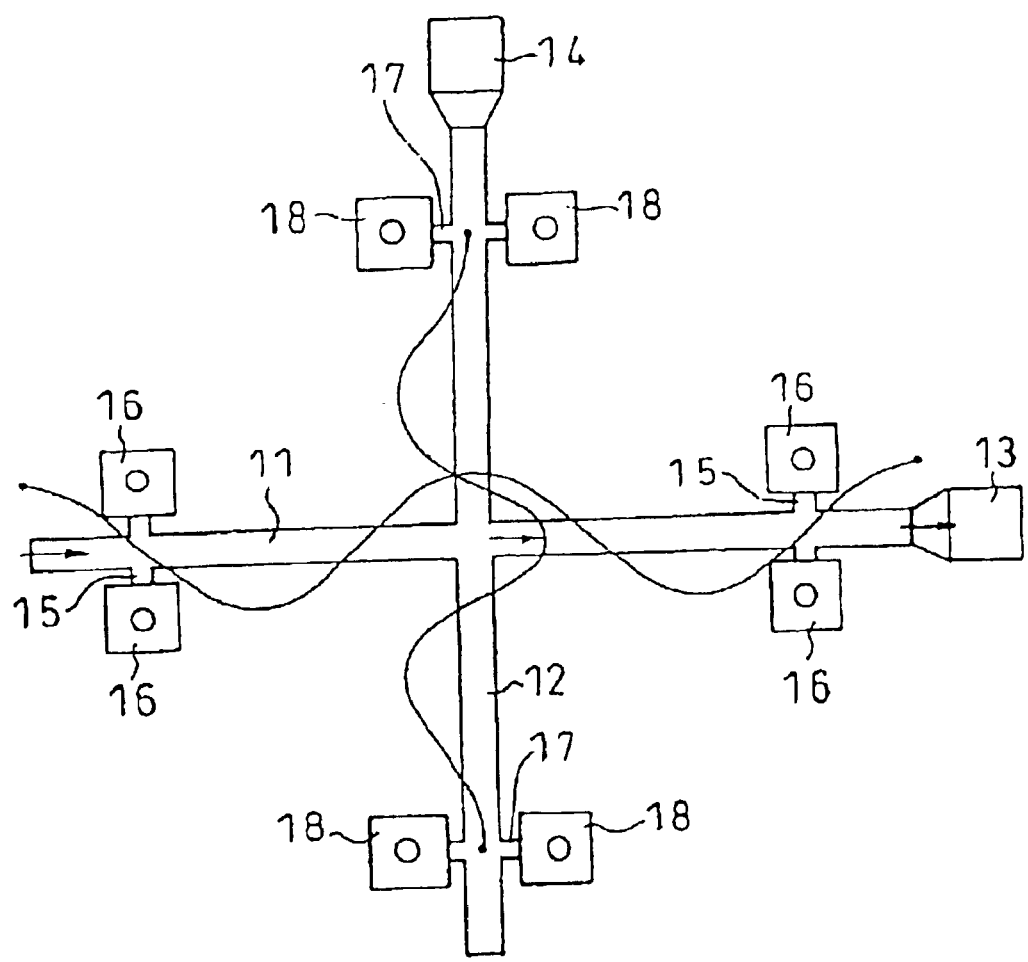
FIG. 10 is a plan view of an essential part of an ultrasonic vibration apparatus of a further embodiment.

Alternatively, it is possible to set, as shown in FIG. 10, the length of the ultrasonic horn 11 for the X-axis direction to the length of 2 wavelengths of longitudinal vibrations generated with the ultrasonic horn 11 and make the third order natural frequency of transverse vibrations of the ultrasonic horn 12 for the Y-axis direction coincide with the frequency of the ultrasonic vibrations.

Figure 9:
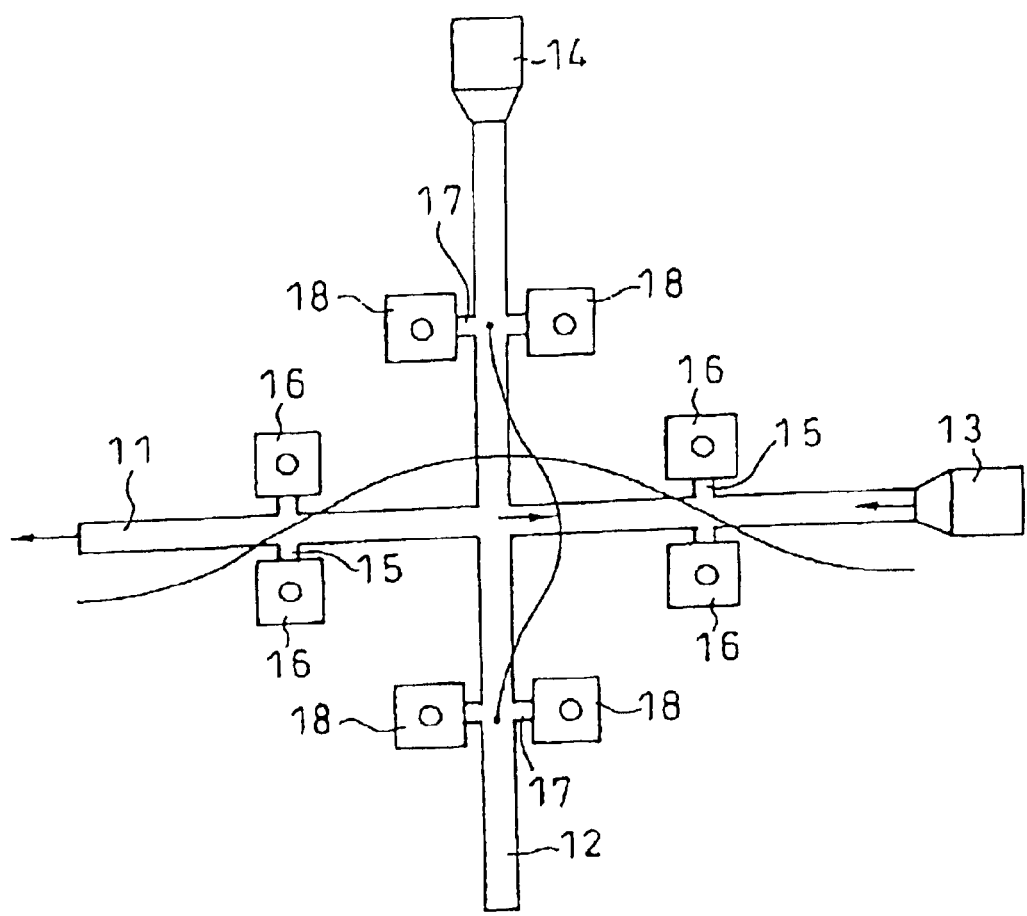
FIG. 9 is a plan view of an essential part of an ultrasonic vibration apparatus of another embodiment.

It is to be noted that, although the shapes and the fixed positions of the ultrasonic horn 11 for the X-axis direction and the ultrasonic horn 12 for the Y-axis direction shown in FIGS. 9 and 10 are drawn symmetrically with each other, it is only necessary to design so that longitudinal vibrations of the ultrasonic horn 11 for the X-axis direction and the ultrasonic horn 12 for the Y-axis direction may resonate with transverse vibrations of the ultrasonic horn 12 for the Y-axis direction and the ultrasonic horn 11 for the X-axis direction, respectively, and the ultrasonic horns 11 and 12 may not necessarily be formed symmetrically.

According to a principal aspect of the present invention relating to an ultrasonic vibration method, a pair of ultrasonic horns are coupled in an intersecting relationship to each other, and a first one of the ultrasonic horns is excited to longitudinally vibrate in a lengthwise direction thereof so that transverse vibrations are generated with a second one of the ultrasonic horn while the second ultrasonic horn is excited to longitudinally vibrate in a longitudinal direction thereof so that transverse vibrations are generated with the first ultrasonic horn, such that composite vibrations of the transverse vibrations of the pair of ultrasonic horns produced at the intersecting coupling point of the pair of ultrasonic horns are used as an output.

Accordingly, with such an ultrasonic vibration method as just described, vibrations of various loci can be generated at the intersecting coupling position of the pair of ultrasonic horns in a plane parallel to the plane which includes the pair of ultrasonic horns.

According to a principal aspect of the present invention relating to an ultrasonic vibration apparatus, it comprises a pair of ultrasonic horns coupled in a substantially intersecting relationship to each other in a predetermined plane, an ultrasonic vibrator attached to an end portion of each of the ultrasonic horns, an ultrasonic oscillator for supplying ultrasonic signals to the pair of ultrasonic vibrators, and a presser provided at the intersecting coupling position of the pair of ultrasonic horns for being pressed against a contact object member; and, the pair of ultrasonic horns are excited to individually vibrate longitudinally such that the contact object member is bonded through the presser by composite vibrations of transverse vibrations produced at the intersecting coupling position.

Accordingly, with such an ultrasonic vibration apparatus as just described, by pressing the presser provided at the intersecting coupling position of the pair of ultrasonic horns against the contact object member, composite vibrations produced at the intersecting coupling position of the pair of ultrasonic horns can be applied to the contact object member, whereby the contact object member can be bonded to another member while the contact object member is ultrasonically vibrated. Thus, an ultrasonic bonding apparatus, which uses ultrasonic vibrations composed of the composite vibrations described above, is provided.

What is claimed is:

1. An ultrasonic vibration method, characterized in that a pair of ultrasonic horns are coupled in an intersecting relationship to each other and a first one of said ultrasonic horns is excited to longitudinally vibrate in a lengthwise direction thereof to cause a second one of said ultrasonic horns to generate transverse vibrations while the second ultrasonic horn is excited to longitudinally vibrate in a lengthwise direction thereof to cause the first ultrasonic horn to generate transverse vibrations such that composite vibrations of the transverse vibrations of said pair of ultrasonic horns which are produced at the intersecting coupling position of said pair of ultrasonic horns are used as an output.

2. An ultrasonic vibration method according to claim 1, characterized in that said pair of ultrasonic horns intersect substantially perpendicularly with each other and produce the composite vibrations within a plane substantially in parallel to a plane which includes said pair of ultrasonic horns.

3. An ultrasonic vibration method according to claim 1, characterized in that a presser is provided at the intersecting coupling position of said pair of ultrasonic horns and projected substantially perpendicularly to a plane which includes said pair of ultrasonic horns, and said presser is pressed against a contact object member to transmit the composite vibrations to the contact object member.

4. An ultrasonic vibration method according to claim 3, characterized in that the contact object member is bonded to another member by the composite vibrations.

5. An ultrasonic vibration method according to claim 1, characterized in that a pair of ultrasonic vibrators for individually providing vibrations to said pair of ultrasonic horns are provided, and a phase relationship between ultrasonic signals to be applied to said pair of ultrasonic vibrators is adjusted.

6. An ultrasonic vibration method according to claim 5, characterized in that adjustment of the phase of one of said pair of ultrasonic vibrators is performed to adjust the phase relationship between the signals to said pair of ultrasonic vibrators.

7. An ultrasonic vibration method according to claim 5, characterized in that the amplitudes or the angular velocities of or the phase difference between the ultrasonic signals to be applied to said pair of ultrasonic vibrators are adjusted to vary the locus of the composite vibrations in a plane parallel to a plane which includes said pair of ultrasonic horns.

8. An ultrasonic vibration method according to claim 1, characterized in that said pair of ultrasonic horns have a length substantially equal to the wavelength of ultrasonic waves which propagate in said pair of ultrasonic horns or substantially equal to an integral number of times the wavelength.

9. An ultrasonic vibration method according to claim 1, characterized in that each of said pair of ultrasonic horns is fixed at least at a position of a node.

10. An ultrasonic vibration method according to claim 8, characterized in that said pair of ultrasonic horns intersect with and are coupled to each other each at a substantially middle portion in the lengthwise direction thereof such that the amplitude of the longitudinal vibrations is maximum at the intersecting coupling position, and are each fixed by fixing means at a position spaced by a half wavelength or a distance of the sum of a half wavelength and an integral number of times one wavelength from the intersecting coupling position.

11. An ultrasonic vibration apparatus, characterized in that it comprises a pair of ultrasonic horns coupled in an intersecting relationship to each other, and a first one of said ultrasonic horns is excited to longitudinally vibrate in a lengthwise direction thereof to cause a second one of said ultrasonic horns to generate transverse vibrations while the second ultrasonic horn is excited to longitudinally vibrate in a lengthwise direction thereof to cause the first ultrasonic horn to generate transverse vibrations such that composite vibrations of the transverse vibrations of said pair of ultrasonic horns which are produced at the intersecting coupling position of said pair of ultrasonic horns are used as an output.

12. An ultrasonic vibration apparatus according to claim 11, characterized in that said pair of ultrasonic horns intersect substantially perpendicularly with each other and produce the composite vibrations within a plane substantially in parallel to a plane which includes said pair of ultrasonic horns.

13. An ultrasonic vibration apparatus according to claim 11, characterized in that it further comprises a presser provided at the intersecting coupling position of said pair of ultrasonic horns and projected substantially perpendicularly to a plane which includes said pair of ultrasonic horns, and said presser is pressed against a contact object member to transmit the composite vibrations to the contact object member.

14. An ultrasonic vibration apparatus according to claim 13, characterized in that the contact object member is bonded to another member by the composite vibrations.

15. An ultrasonic vibration apparatus according to claim 11, characterized in that it further comprises a pair of ultrasonic vibrators for individually providing vibrations to said pair of ultrasonic horns, and a phase relationship between ultrasonic signals to be applied to said pair of ultrasonic vibrators is adjusted.

16. An ultrasonic vibration apparatus according to claim 15, characterized in that adjustment of the phase of at least one of said pair of ultrasonic vibrators is performed.

17. An ultrasonic vibration apparatus according to claim 11, characterized in that the amplitudes or the angular velocities of, or the phase difference between, the ultrasonic signals to be applied to said pair of ultrasonic vibrators are adjusted to vary the locus of the composite vibrations in a substantially same plane.

18. An ultrasonic vibration apparatus according to claim 11, characterized in that said pair of ultrasonic horns have a length substantially equal to the wavelength of ultrasonic waves which propagate in said pair of ultrasonic horns or substantially equal to an integral number of times the wavelength.

19. An ultrasonic vibration apparatus according to claim 11, characterized in that each of said pair of ultrasonic horns is fixed at least at a position of a node by fixing means.

20. An ultrasonic vibration apparatus according to claim 11, characterized in that said pair of ultrasonic horns intersect with and are coupled to each other each at a substantially middle portion in the lengthwise direction thereof such that the longitudinal vibrations exhibits a maximum amplitude at the intersecting coupling position, and each are fixed by fixing means at a position spaced substantially by a half wavelength or a distance of the sum of a half wavelength and an integral number of times one wavelength from the intersecting coupling position.

21. An ultrasonic vibration apparatus according to claim 11, characterized in that an odd-numbered order natural frequency of the transverse vibrations of the first ultrasonic horn substantially coincides with the frequency of an ultrasonic vibrator of the second ultrasonic horn which intersects with the first ultrasonic horn such that the transverse vibrations thereof substantially resonate with the ultrasonic vibrations of the second ultrasonic horn.

22. An ultrasonic vibration apparatus, characterized in that it comprises a pair of ultrasonic horns coupled in a substantially intersecting relationship to each other in a predetermined plane, an ultrasonic vibrator attached to an end portion of each of said ultrasonic horns, an ultrasonic oscillator for supplying ultrasonic signals to the pair of ultrasonic vibrators, and a presser provided at the intersecting coupling position of said pair of ultrasonic horns for being pressed against a contact object member, and that said pair of ultrasonic horns are excited to individually vibrate longitudinally such that the contact object member is bonded through said presser by composite vibrations of transverse vibrations produced at the intersecting coupling position.

23. An ultrasonic vibration apparatus according to claim 22, characterized in that it further comprises phase adjustment means for adjusting the phase of the ultrasonic signals to be applied to said pair of ultrasonic vibrators.

24. An ultrasonic vibration apparatus according to claim 23, characterized in that said phase adjustment means is provided between at least one of said ultrasonic vibrators and said ultrasonic oscillator.

25. An ultrasonic vibration apparatus according to claim 22, characterized in that the amplitudes or the angular velocities of, or the phase difference between, the ultrasonic signals to be applied to said pair of ultrasonic vibrators are adjusted to vary the locus of the composite vibrations in the predetermined plane.

26. An ultrasonic vibration apparatus according to claim 22, characterized in that one of said ultrasonic horns has a length substantially equal to the wavelength of ultrasonic waves which propagate in said ultrasonic horns or substantially equal to an integral number of times the wavelength.

27. An ultrasonic vibration apparatus according to claim 22, characterized in that each of said pair of ultrasonic horns is fixed at least at a position of a node by fixing means.

28. An ultrasonic vibration apparatus according to claim 22, characterized in that said pair of ultrasonic horns intersect with and are coupled to each other each at a substantially middle portion in the lengthwise direction thereof such that the amplitude of the longitudinal vibrations is maximum at the intersecting coupling position, and are each fixed by fixing means at a position spaced by a half wavelength or a distance of the sum of a half wavelength and an integral number of times one wavelength from the intersecting coupling position.

29. An ultrasonic vibration apparatus according to claim 22, characterized in that an odd-numbered order natural frequency of the transverse vibrations of a first one of said ultrasonic horns substantially coincides with the frequency of said ultrasonic vibrator of a second one of said ultrasonic horns which intersects with the first ultrasonic horn such that the transverse vibrations thereof substantially resonate with the ultrasonic vibrations of the second ultrasonic horn.

* * * * *